(12) United States Patent
Hsieh

(10) Patent No.: US 6,966,551 B2
(45) Date of Patent: Nov. 22, 2005

(54) UNLOADING APPARATUS FOR PLATE-LIKE WORKPIECE CUTTING MACHINE

(75) Inventor: Min-Hsiung Hsieh, Changhua (TW)

(73) Assignee: Sogotec Enterprise Co., Ltd., Taichung (TW)

( * ) Notice: Subject to any disclaimer, the term of this patent is extended or adjusted under 35 U.S.C. 154(b) by 108 days.

(21) Appl. No.: 10/397,317

(22) Filed: Mar. 27, 2003

(65) Prior Publication Data

US 2004/0187663 A1 Sep. 30, 2004

(51) Int. Cl.⁷ .................................................. B23Q 3/02
(52) U.S. Cl. ........................ 269/47; 269/54.5; 29/464; 83/423; 83/451; 83/929.1; 414/27
(58) Field of Search .................... 83/145, 423, 709, 83/710, 711, 929.1, 457; 29/464, 729, 830; 269/47, 54.1, 54.4, 54.5; 414/27, 788.9, 789.9

(56) References Cited

U.S. PATENT DOCUMENTS

| | | | | |
|---|---|---|---|---|
| 1,806,887 A | * | 5/1931 | Bruno | 269/54.5 |
| 4,127,432 A | * | 11/1978 | Kuwano et al. | 156/297 |
| 4,403,899 A | * | 9/1983 | Lampe et al. | 414/788.9 |
| 4,506,442 A | * | 3/1985 | Alzmann et al. | 29/830 |
| 4,822,015 A | * | 4/1989 | Glasman et al. | 269/54.1 |
| 5,090,669 A | * | 2/1992 | Pieroni | 269/54.5 |
| 5,768,772 A | * | 6/1998 | Buechele | 29/830 |
| 5,970,606 A | * | 10/1999 | Buechele | 29/830 |
| 5,984,293 A | * | 11/1999 | Abrahamson et al. | 269/266 |
| 6,508,154 B1 | * | 1/2003 | Tripard | 83/467.1 |
| 6,718,858 B2 | * | 4/2004 | Tripard | 83/467.1 |

FOREIGN PATENT DOCUMENTS

JP 1-317917 * 12/1989 .................. 414/27

* cited by examiner

*Primary Examiner*—Clark F. Dexter

(57) ABSTRACT

An improved unloading apparatus for a plate-like workpiece cutting machine includes a platform, a faceplate, a lift device, and an intermediate member. The platform is provided with a channel recessed downwards from a top side thereof. The faceplate is mounted on the top side of the platform to seal the channel for putting to-be-machined plate-like workpieces thereon and is provided with a plurality of through holes. The lift device is mounted below the faceplate and includes a power unit and a supporting member, which can be driven to be lifted and lowered by the power unit. The intermediate member is disposed with a plurality of locating columns corresponding in locations to the through holes of the faceplate and is mounted on a top side of the supporting member.

5 Claims, 5 Drawing Sheets

UNLOADING APPARATUS FOR PLATE-LIKE WORKPIECE CUTTING MACHINE

BACKGROUND OF THE INVENTION

1. Field of the Invention

The present invention relates generally to plate-like workpiece cutting machines, and more particularly to an improved unloading apparatus for a plate-like workpiece cutting machine. The unloading apparatus unloads workpieces smoothly without interference so as to prevent the workpieces from deformation and damage.

2. Description of the Related Art

As shown in FIG. 1, a conventional plate-like workpiece cutting machine, such as a circuit board cutting machine, includes a faceplate 1 disposed with a plurality of locating pins 2 corresponding in positions to a plurality of locating holes 4 of circuit boards 3 to be cut. Accordingly, when a plurality of circuit boards 3 are mounted on the faceplate 1, the locating holes 4 are vertically aligned with one another for the locating pins 2 running there through such that the circuit boards 3 are stacked regularly on the faceplate 1 to facilitate cutting or other processing procedures. After the circuit boards 3 have been processed by the cutting or other processing procedures, it takes people to unload the circuit boards 3 from the faceplate 1 such that the unloading operation is not very smooth and it may damage the circuit boards 3 and results in wasting human resource and valuable time.

To improve the above-mentioned drawbacks, an improved unloading apparatus for the circuit board cutting machine was disclosed as shown in FIGS. 2 and 3. The improvement is characterized in that a carrier 6 is mounted on the faceplate 5 and is provided with a plurality of through holes 9 thereon. When the circuit boards 7 or other plate-like workpieces are stacked on the carrier 6, the locating pins 8 of the faceplate 5 are correspondingly inserted into the through holes 9 of the carrier 6 and the locating holes 10 of the circuit boards 7, thereby positioning and further processing the circuit boards 7. After processing the circuit boards 7, two block members 14 are driven forward respectively by two pneumatic cylinder 15 and then stopped against the faceplate 5, and the carrier 6 is lifted by a plurality of lift columns 12 driven by a pneumatic cylinder 11 such that the circuit boards 7 can be easily and smoothly unloaded from the locating pins 8. Although the above structurally improved unloading apparatus for the cutting machine can unload the circuit boards without people, while it's operated in practice, there are still disadvantages as follows:

1. When the lift columns 12 are driven by the pneumatic cylinder 11 to lift the carrier 6, if the lift columns 12 lift the carrier 6 too quickly, the carrier 6 may be deformed so as to hamper the lifting operation.

2. To prevent the lift columns 12 from contacting against the circuit boards 7 and further deforming and damaging the circuit boards 7, the carrier 6 must be installed between the circuit boards 7 and the lift columns 12 such that the whole structure of the unloading apparatus becomes complicated.

3. The faceplate 5 is provided with the through holes 13 for the lift columns 12 to run through such that the locating pins 8 as well as the locating holes are restrictedly positioned.

SUMMARY OF THE INVENTION

The primary objective of the present invention is to provide an improved unloading apparatus, which unloads workpieces smoothly without interference, for a plate-like workpiece cutting machine.

Another objective of the present invention is to provide an improved unloading apparatus, which prevents the workpieces from deformation and damage, for a plate-like workpiece cutting machine.

Still another objective of the present invention is to provide an improved unloading apparatus, on which locating holes are not restrictedly positioned on the workpieces, for a plate-like workpiece cutting machine.

The foregoing objectives of the present invention are attained by the improved unloading apparatus, which is composed of a platform, a faceplate, a lift device, and an intermediate member. The platform is provided with a channel recessed downwards from a top side thereof. The faceplate is mounted on the top side of the platform to seal the channel for plate-like workpieces positioned thereon and is provided with a plurality of through holes. The lift device is mounted below the faceplate and includes a power unit and a supporting member, which can be driven to be lifted and lowered by the power unit. The intermediate member is disposed with a plurality of locating columns corresponding in location to the through holes of the faceplate and is mounted on a top side of the supporting member. Accordingly, workpieces can be unloaded smoothly and successfully by the unloading apparatus so as to avoid deformation and damage.

DETAILED DESCRIPTION OF THE INVENTION

Figure 1:
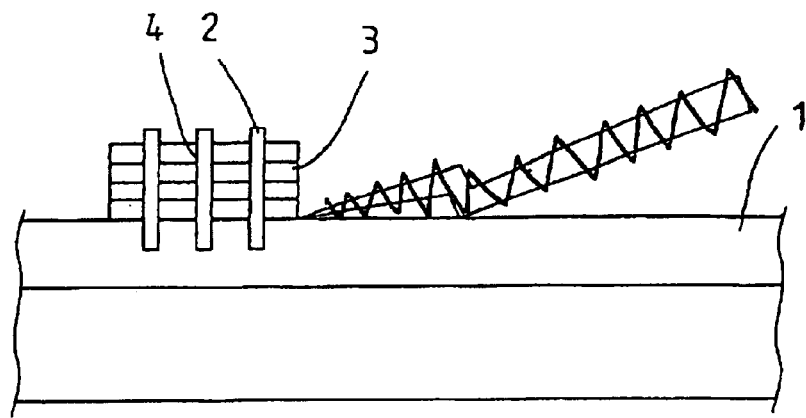
FIG. 1 is a schematic view of a conventional plate-like workpiece cutting machine at work.
Figure 2:
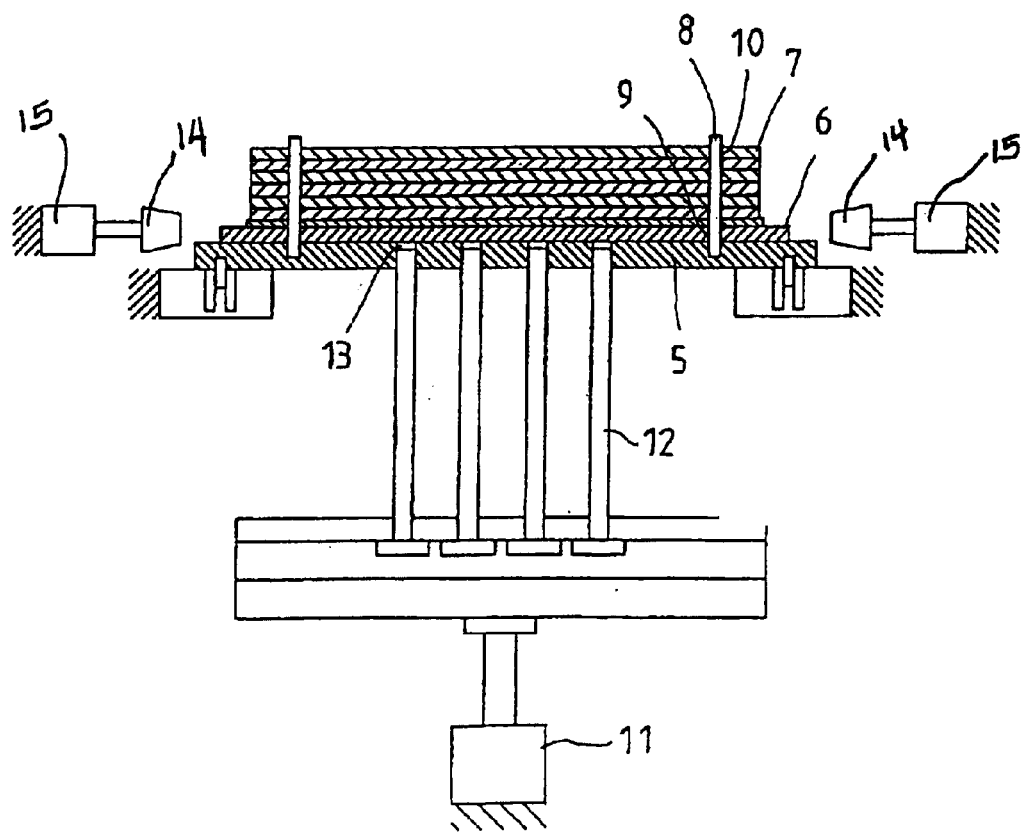
FIGS. 2 and 3 show an unloading apparatus at work for another conventional plate-like workpiece cutting machine.
Figure 3:
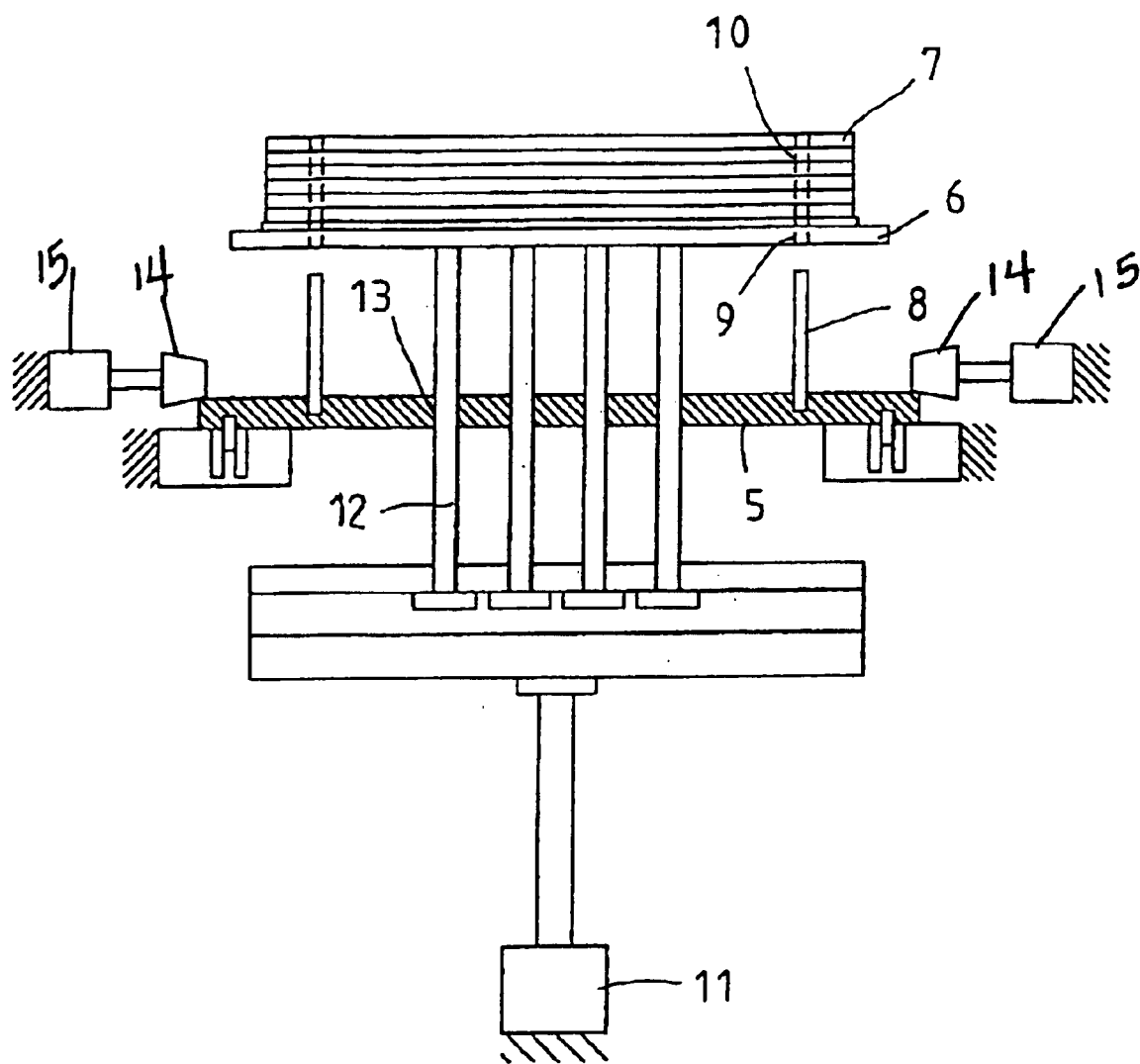
Figure 4:
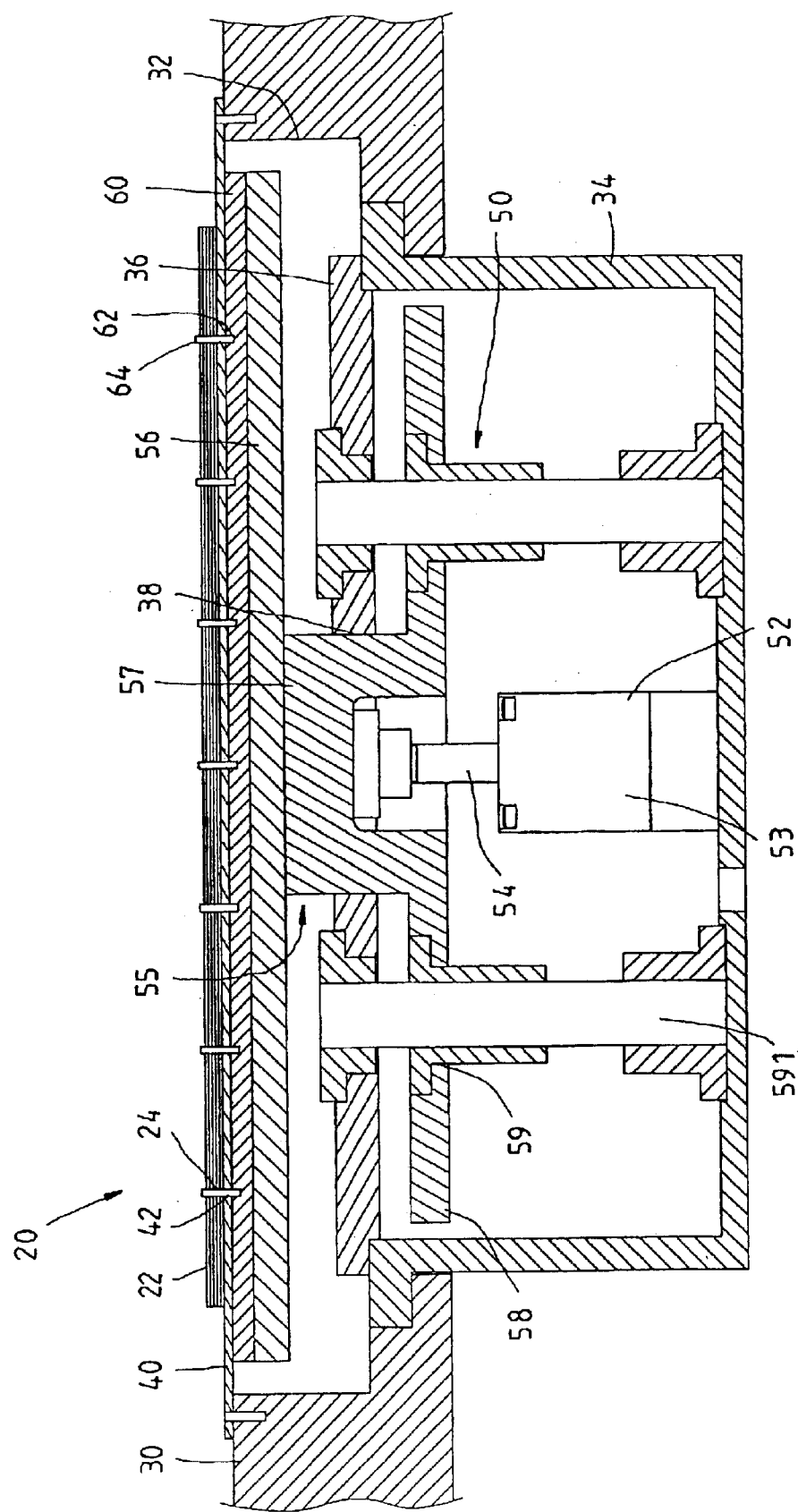
FIG. 4 is a sectional view of a preferred embodiment of the present invention.
Figure 5:
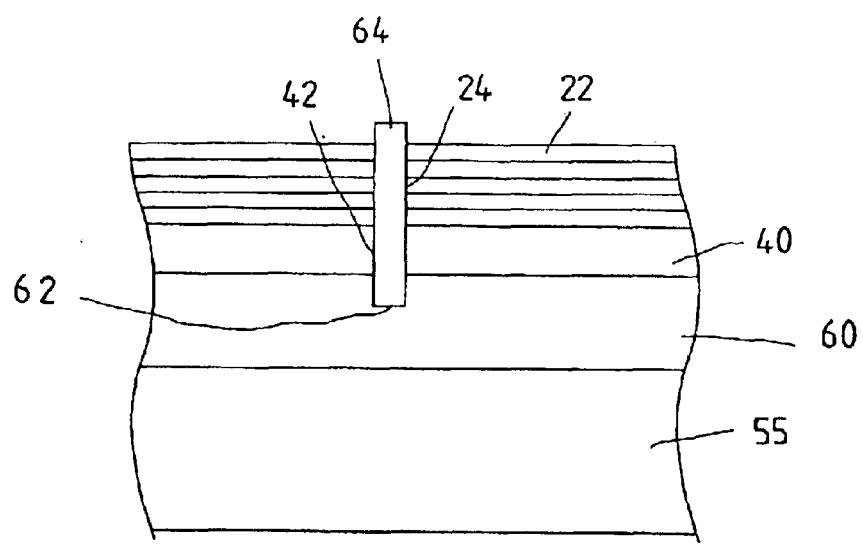
FIG. 5 is a partial elevational view of the preferred embodiment of the present invention.
Figure 6:
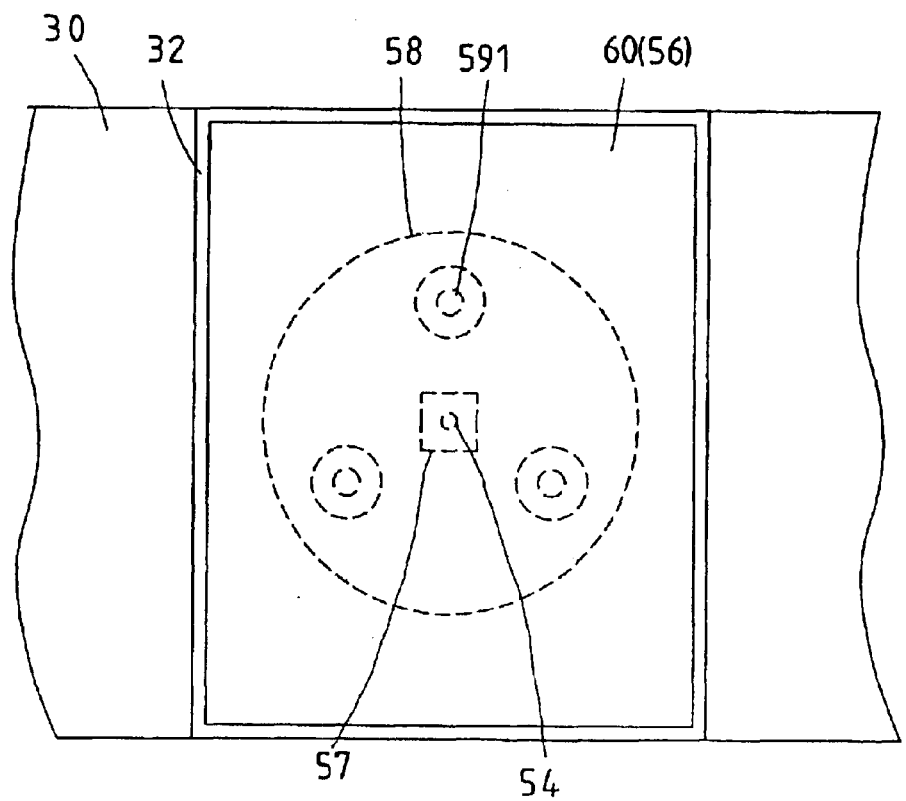
FIG. 6 is a top view of a lift device of the preferred embodiment of the present invention.

Referring to FIGS. 4–6, an unloading apparatus 20 in accordance with a preferred embodiment of the present invention is provided for loading and positioning a plurality of plate-like workpieces 22, such as circuit boards, and for unloading the workpieces 22 successfully and smoothly after the workpieces 22 have been cut by a plate-like workpiece cutting machine (not shown). The unloading apparatus 20 is composed of a platform 30, a faceplate 40, a lift device 50, and an intermediate member 60.

The platform 30 has a smooth top side and a rectangular channel 32 thereon, which is recessed downward from the top side of the platform 30 and is stepped at an inner edge thereof Additionally, the platform 30 is fixedly mounted with a box-like base 34, which is disposed with a topside member 36 at a top side thereof The topside member 36 is provided with a rectangular axial hole-38 at the center thereof.

The faceplate 40 is fixedly mounted on the top side of the platform 30 to seal the channel 32 for putting the plate-like workpieces 22 thereon, and includes a plurality of through holes 42. The plate-like workpieces 22 have a plurality of locating holes 24 corresponding in location to the through holes 42.

The lift device 50 includes a power unit 52 and a supporting member 55 driven by the power unit 52 to be lifted and lowered. The power unit 52 is embodied as a pneumatic cylinder 53, which is fixedly mounted in the base 34 and has an arbor 54 extending upwards and connected with the supporting member 55. The supporting member 55 has a plate-like top portion 56 within the channel 32, a rectangular shaft 57 extending downwards from the center of the top portion 56 and running through the axial hole 38 of the topside member 36, and a circular bottom portion 58 positioned below the topside member 36 and extending transversally horizontally outwards from a bottom end of the rectangular shaft 57. The circular bottom portion 58 is provided with three guide holes 59 spaced apart from one another at an identical interval for inserting three guide bars 591 therethrough. Each of the three guide bars 591 is connected with the topside member 36 and the base 34 respectively at a top end thereof and a bottom side thereof and is axially parallel to the arbor 54 of the pneumatic cylinder 53. Accordingly, the supporting member 55 can be driven by the pneumatic cylinder 53 to be lifted and lowered and will not be lifted unevenly by the guide holes 59 and the guide bars 591, which help the supporting member 55 to be lifted stably and successfully.

The intermediate member 60 is mounted on a top side of the supporting member 55 and has a plurality of embedding holes 62 corresponding in location to the through holes 42 of the faceplate 40 for embedding bottom ends of a plurality of locating columns 64 into the embedding holes 62, thereby inserting the locating columns 64 upwards into the through holes 42 of the faceplate 40 and the locating holes 24 of the workpieces 22. The through holes 42 of the faceplate 40 are larger in diameter than the embedding holes 62 of the intermediate member 60.

Figure 7:
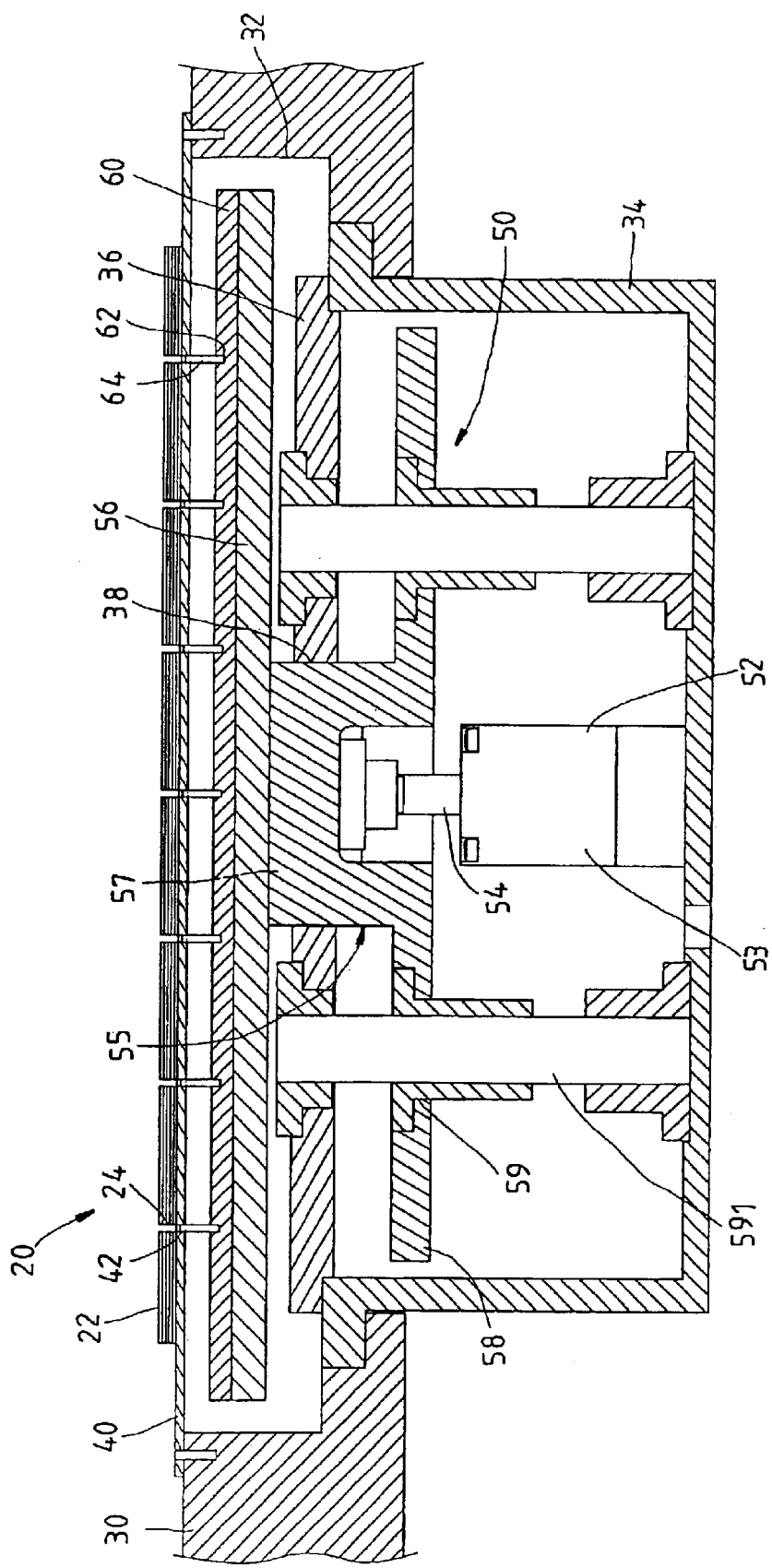
FIG. 7 is a schematic view of the preferred embodiment of the present invention at work.

In assembly, while the workpieces 22 are not put on the faceplate 40, the intermediate member 60 is driven by the lift device 50 to contact against a bottom side of the faceplate 40. The embedding holes 62 of the intermediate member 60, which are smaller than the locating holes 24 of the plate-like workpieces 22 in diameter, are drilled by a cutting machine (not shown), and then the through holes 42 of the faceplate, which are larger in diameter than the embedding holes of the intermediate member, are also drilled such that the through holes 42 of the faceplate 40 are vertically aligned with the embedding holes 62 of the intermediate member 60 without any restriction. Next, the locating columns 64 are inserted into the embedding holes 62. Accordingly, when one workpiece 22 is put on the faceplate 40, the locating columns 64 fit in and run through the locating holes 24 correspondingly, such that a plurality of the workpieces can be regularly stacked on a predetermined position of the faceplate 40 for being machined by the cutting machine (not shown). After the aforementioned machining procedure is done, the intermediate member 60 is lowered by the lift device 50, as shown in FIG. 7, and then the locating columns 64 are removed away from the locating holes 24 of the workpieces 22, thereby completing the unloading procedure.

During the unloading procedure, the plate-like workpieces 22 are positioned stably on the faceplate 40 with no external forces exerted thereon, such that no matter how quick the supporting member 55 is lifted or lowered, the workpieces 22 will be free from deformation. In addition, the unloading apparatus 20 is structurally less complicated than the prior art, and the locating columns 64 can be positioned without restriction and further be in corresponding position to the locating holes 24 of the workpieces 22, thereby improving the aforesaid drawbacks of the prior art.

It is to be noted that the power unit 52, can be embodied as other alternative devices, such as a servomotor along with belts or gears. Moreover, the guide bars 591 are not necessarily three in quantity for the present invention but only one guide bar will still help the supporting member 55 to be lifted stably and successfully.

What is claimed is:

1. An unloading apparatus for a plate-like workpiece cutting machine, said unloading apparatus comprising:
   a platform having a channel recessed downwards and a base fixedly mounted at a bottom side of the platform;
   a faceplate having a plurality of through holes and mounted on a top side of said platform to seal said channel for putting plate-like workpieces on said faceplate;
   a lift device mounted below said faceplate and having a power unit installed in said base and a supporting member driven to be lifted and lowered by said power unit, said supporting member having a top portion, a shaft extending downwards from said top portion said top portion extending transversally outwards with respect to a top end of said shaft, and a bottom portion extending transversally outwards from a bottom end of said shaft and having at least one guide hole and at least one guide bar running through said at least one guide hole, said guide bar is fixedly mounted to said base; and
   an intermediate member mounted on the top portion of said supporting member and provided with a plurality of locating columns in corresponding locations to said through holes of said faceplate.

2. The unloading apparatus as defined in claim 1, wherein said power unit is a pneumatic cylinder having an arbor connected with said supporting member.

3. The unloading apparatus as defined in claim 1, wherein said base has a topside member positioned between said top portion and said bottom portion of said supporting member, said topside member having an axial hole at its center and said shaft extending through said axial hole.

4. The unloading apparatus as defined in claim 1, wherein said bottom portion of said supporting member has three of said guide holes spaced apart from one another at an identical interval, and three said guide bars extending through said guide holes.

5. The unloading apparatus as defined in claim 1, wherein said intermediate member has a plurality of embedding holes at a top side thereof, said embedding holes being in corresponding position to said through holes of said faceplate, and bottom ends of said locating columns fixed in said through holes.

* * * * *